United States Patent [19]

Kaga et al.

[11] Patent Number: 4,967,247
[45] Date of Patent: Oct. 30, 1990

[54] VERTICAL DYNAMIC RANDOM ACCESS MEMORY

[75] Inventors: Toru Kaga, Saitama; Yoshifumi Kawamoto, Kanagawa; Hideo Sunami, Tokyo, all of Japan

[73] Assignee: Hitachi, Ltd, Tokyo, Japan

[21] Appl. No.: 279,350

[22] Filed: Dec. 2, 1988

[30] Foreign Application Priority Data

Dec. 10, 1987 [JP] Japan .................. 62-310821

[51] Int. Cl.⁵ ............... H01L 29/78; H01L 27/02; H01L 27/12; H01L 29/06
[52] U.S. Cl. ........................ 357/23.6; 357/41; 357/49; 357/55; 357/56
[58] Field of Search .............. 357/23.6, 41, 49, 55, 357/56

[56] References Cited

U.S. PATENT DOCUMENTS

| | | | |
|---|---|---|---|
| 4,638,460 | 1/1987 | Matsumoto | 365/149 |
| 4,686,552 | 8/1987 | Teng et al. | 357/23.6 |
| 4,704,705 | 11/1987 | Womack | 357/23.6 |
| 4,737,829 | 4/1988 | Morimoto et al. | 357/23.6 |
| 4,833,516 | 5/1989 | Hwang et al. | 357/23.6 |

FOREIGN PATENT DOCUMENTS

| | | | |
|---|---|---|---|
| 59-19366 | 1/1984 | Japan | 357/23.6 |
| 62-36851 | 2/1987 | Japan | 357/23.6 |
| 62-286269 | 12/1987 | Japan | 357/23.6 |
| 63-09142 | 1/1988 | Japan | 357/23.6 |
| 63-10557 | 1/1988 | Japan | 357/23.6 |

OTHER PUBLICATIONS

High-Density One-Device Dynamic MOS Memory Cells, by Itoh et al., IEE Proc., vol. 130, Pt. I, No. 3, pp. 127–135, Jun. 1983.
A 4-Mbit DRAM with Folded-Bit-Line Adaptive Sidewall-Isolated Capacitor (FASIC) Cell, by Mashiko et al., J. Sol. State Cir., vol. 22, No. 5, Oct. 1987.
Trends in Megabit DRAM Circuit Design, by K. Itoh, Central Research Lab., Hitachi, Ltd., pp. 21–27, 1988.

*Primary Examiner*—Gene M. Munson
*Attorney, Agent, or Firm*—Fay, Sharpe, Beall, Fagan, Minnich & McKee

[57] ABSTRACT

A semiconductor memory comprises a switching device and a charge-storage device disposed at the upper and lower sides, respectively, of each of semiconductor islands. The islands are formed on a semiconductor substrate that is completely isolated from the semiconductor substrate by an insulator. The switching device and charge-storage device are substantially the same width. The memory cell structure is extremely small. The cell structure is highly resistant to alpha-particles and is formed self-aligned. During manufacture, the SiO₂ island is oxidized adjacent its lower end to insulate the island from the substrate.

27 Claims, 14 Drawing Sheets

VERTICAL DYNAMIC RANDOM ACCESS MEMORY

BACKGROUND OF THE INVENTION

The present invention relates to a semiconductor memory and, more particularly, to a dynamic random access memory cell having a vertical transistor which is suitable for achieving high integration.

Japanese Patent Laid-Open No. 62-140456 (1985) discloses a dynamic random access memory wherein a memory cell comprising a vertical MIS transistor and a capacitor device is formed on a silicon island.

FIG. 1 is a sectional view showing the above-described conventional semiconductor memory. The dynamic random access memory of FIG. 1 includes a vertical MIS transistor which includes a p-type silicon island 22 formed on a p-type silicon substrate 21, a highly doped n-type impurity diffused layer 16, a word line 17 which operates as a gate electrode, a gate insulator 7, and a highly doped n-type impurity diffused layer 12. A charge-storage device includes the highly doped n-type impurity diffused layer 12, a capacitor insulator 3, and a plate electrode 13.

In the FIG. 1 prior art, the silicon island 22 that is employed to form a dynamic random access memory cell is electrically connected directly with the silicon substrate 21. There is a strong possibility that the charge stored in the cell will be reduced or destroyed, i.e., soft-error will occur. That is, positive or negative charges which are generated in the silicon substrate 21 along the track of any alpha particles passing through the silicon substrate into the island will gather in the highly doped n-type impurity diffused layer 12 of the capacitor.

Further, in the prior art no consideration is given to formation of a very small memory cell.

SUMMARY OF THE INVENTION

In one feature of the present invention, an insulator is formed at the boundary between a semiconductor island an a body, especially a semiconductor substrate to electrically isolate the semiconductor island from the body (the semiconductor substrate). A switching device and a charge-storage device are located at the upper and lower sides, respectively of the semiconductor island.

Another feature of the present invention resides in forming a memory cell without the need for mask alignment after the formation of the semiconductor island (columnar). Accordingly, in the structure of the present invention, the substrate, insulators, plate electrode, gate electrode, and date line are all provided at respective fixed positions, which are determined by process conditions.

The semiconductor memory according to the present invention is produced. In the first step a antioxidation film is deposited on a semiconductor substrate. Then anisotropic etching is carried out to etch the first antioxidation film and the semiconductor substrate. In this manner, a semiconductor island is formed having the first antioxidation film mounted on its upper end. In the second step, a second antioxidation film is deposited on the semiconductor substrate formed with the semiconductor island. Then anisotropic etching is carried out leaving the second antioxidation film on the sidewall of the semiconductor island. Further anisotropic etching is carried out using the first and second antioxidation films left on the upper end and sidewall of the semiconductor island as masks, thereby further etching the semiconductor substrate. In the third step, a third antioxidation film is deposited on the semiconductor substrate formed with the semiconductor island. Then anisotropic etching is carried leaving the third antioxidation film on the sidewall of the semiconductor island. In the forth step the surface of the semiconductor substrate is oxidized using the first to third antioxidation films as masks to form an insulator by which the semiconductor island is isolated from the semiconductor substrate.

The semiconductor island that has a capacitor serving as the charge-storage capacitor of a memory cell is isolated from the semiconductor substrate by the insulator. Even if alpha particles are injected and charges are thereby generated within the semiconductor substrate along the track of the alpha particles, the charges are blocked by the insulator and thus prevented from entering the semiconductor island. Accordingly, an abnormal memory operation due to soft-error phenomena is inhibited. Further, noise charges generated in the peripheral circuit are also blocked by the insulator and therefore an abnormal memory operation attributable to intrusion of the noise charges is also inhibited.

One advantage of the present invention is that soft-error phenomena are unlikely to occur.

Another advantage of the present invention is that the semiconductor memory manufacturing process needs no mask alignment step.

These and other attendant advantages of this invention will be readily appreciated as the same becomes better understood by reference to the following detailed description when considered in connection with the accompanying drawings.

DETAILED DESCRIPTION OF THE INVENTION

EMBODIMENT 1

Figure 1:
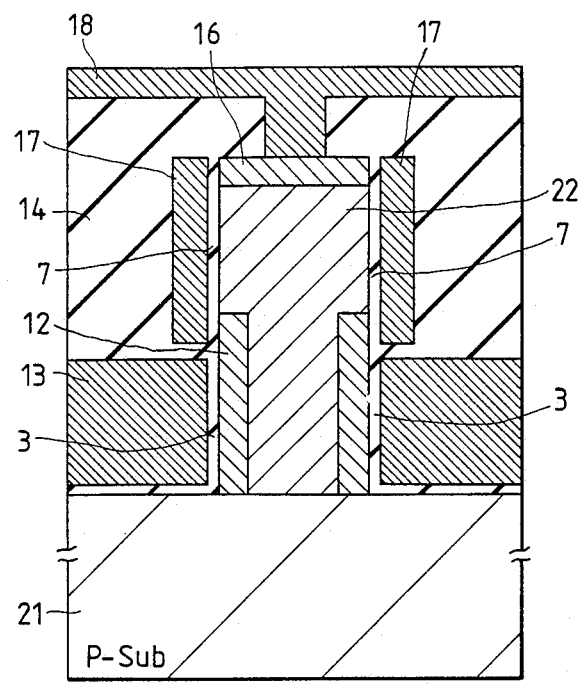
FIG. 1 is a section view of one example of a conventional prior art semiconductor memory.
Figure 2:
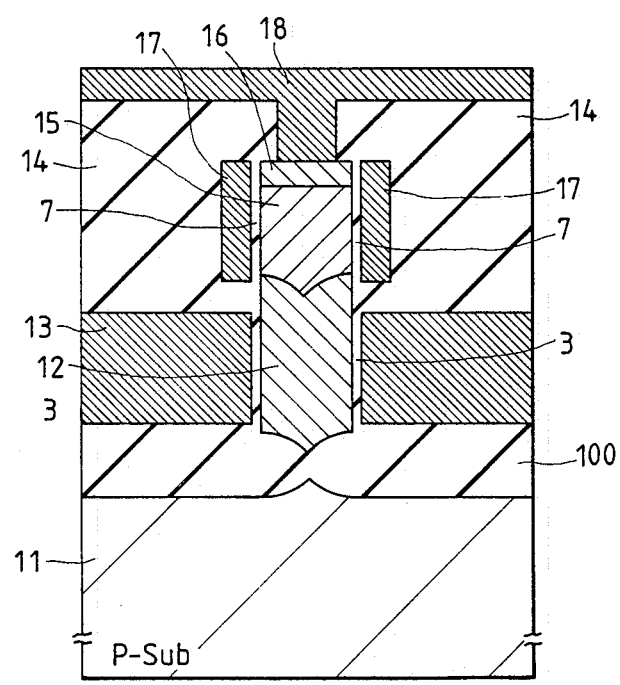
FIG. 2 is a sectional view of the first embodiment of the semiconductor memory according to the present invention.

A first embodiment of the present invention will be described hereunder in detail with reference to FIG. 2 and FIGS. 3(a) to 3(j).

In this embodiment, a dynamic random access memory includes a vertical MIS transistor, which includes a silicon island 15 isolated from p-type silicon substrate 11 by an insulator 100, e.g. $SiO_2$, A highly doped n-type impurity layer 16 and a gate electrode 17 separated by a gate insulator 7 operate as a word line. A data line 18 is connected to the highly doped n-type impurity layer 16. A charge-storage device includes a highly doped n-type impurity layer 12, a capacitor insulator 3, and a plate electrode 13. The plate electrode can be fed any potential voltage with regard to a potential of the silicon substrate 11. This is advantageous for clear mode operation. This embodiment has the advantage that soft-error phenomena due to injection of alpha particles are unlikely to occur since the whole memory cell is isolated from the silicon substrate 11 by the insulator 100. The memory cell structure is also highly resistant to noise charges applied from a peripheral circuit.

It should be noted that the highly doped n-type impurity diffused layer 12 does not necessarily need to extend as far as the center of the silicon island 15 but only needs to be formed in the surface region of the sidewall of the silicon island 15.

FIG. 3(a) to FIG. 3(j) show in combination one embodiment of the process for producing the semiconductor memory according to the present invention.

Figure 3A:
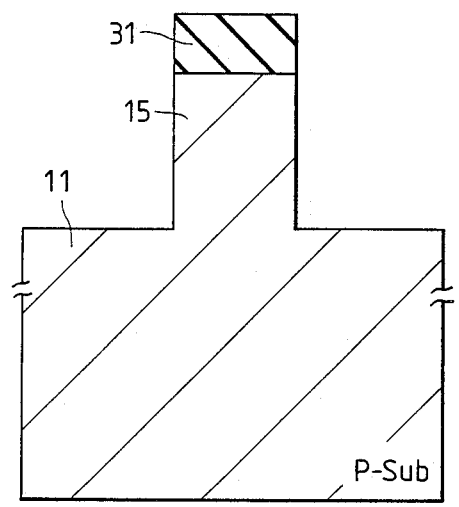
FIGS. 3(a) to 3(j) are sectional views showing a process of producing the semiconductor memory according to the present invention.

With reference to FIG. 3(a), a first $Si_2N_4$ film 31 having a thickness of, for example, 300 nm, is first deposited on a semiconductor substrate, especially a silicon substrate 11 by chemical vapor deposition (hereinafter referred to as "CVD"). During the deposition, $SiH_4$ and $NH_3$ are allowed to react with each other at from 750° C. to 800° C. for about an hour to form and deposit the $Si_3N_4$ film. Thereafter, a photoresist film (not shown) is formed on the $Si_3N_4$ film 31 by use of photolithography technique. An anisotropic dry etching process is carried out using the resist film as a mask to etch the $Si_3N_4$ film 31 and the silicon substrate 11 so as to form a semiconductor portion, especially a silicon island 15.

To etch $Si_3N_4$, it is preferable to use an anisotropic dry etching that employs a plasma atmosphere containing fluorine, e.g., $(CF_3+O_2)$, $CH_2F_2$, $CHF_3$, $CH_3F$, $(CH_4+F_2)$, etc.

To etch Si, it is preferable to use a plasma atmosphere containing chlorine, eg., $CCl_4$, $Cl_2$, etc. The etching depth of Si is about 1 $\mu$m.

Figure 3B:
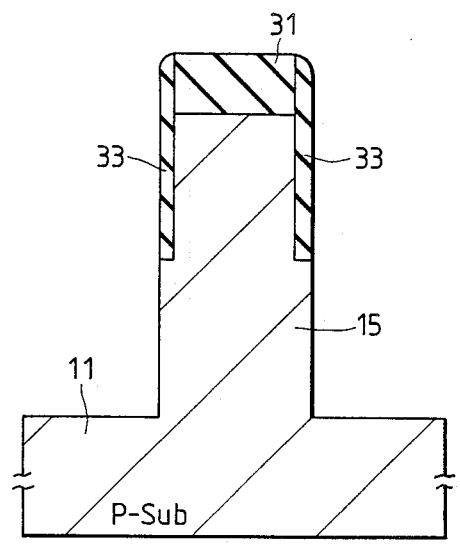

With reference to FIG. 3(b), a second $Si_3N_4$ film having a thickness of about 40 nm is deposited on the silicon island 15 and the silicon substrate Il by CVD. Anisotropic etching is carried out so that the second $Si_3N_4$ film 33 is removed from the top face of $Si_3N_4$ film 31 and left only on the sidewall of the silicon island 15. Thereafter anisotropic dry etching is further conducted to etch the silicon substrate 11 so that the silicon island 15 is elongated.

The $Si_3N_4$ depositing method, the $Si_3N_4$ etching method, and the Si etching method are preferably the same as employed in the step described with reference to FIG. 3(a) except for the time. The etching depth of the Si in this step is from 2 to 3 $\mu$m.

Figure 3C:
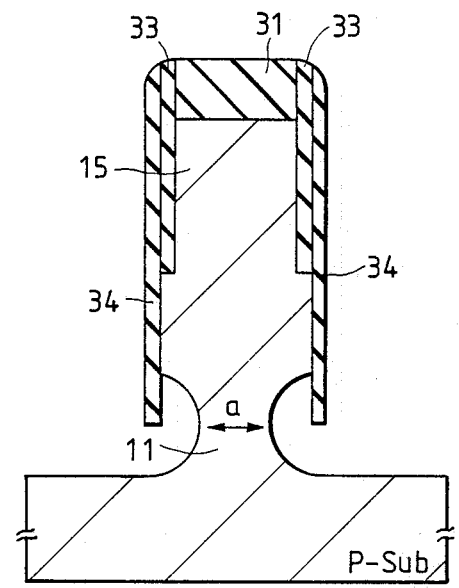

With reference to FIG. 3(c), a third $Si_3N_4$ film 34 having a thickness of about 50 nm is deposited on the silicon island 15 and the silicon substrate 11 by CVD. Anisotropic etching is carried out so that the third $Si_3N_4$ film 34 is removed from the top of film 31 and left only on the sidewall of film 33 and the silicon island 15. Thereafter, the silicon substrate 11 is etched by isotropic etching such that the root or base of the silicon island 15 is constricted to a narrower width a.

The $Si_3N_4$ deposition method and $Si_3N_4$ etching method are preferably the same employed in the preceding step except for the time.

The isotropic etching of the silicon substrate may be conducted using either a dry etching process that employs a plasma atmosphere containing $SF_6$ as the principal constituent or a wet etching process. In the wet etching process, an aqueous solution is prepared by mixing HF and $HNO_3$ in a molar ratio of 1:100 or more and adding water to the mixture in an amount of from several % to several tens times the amount of the mixture.

Figure 3D:
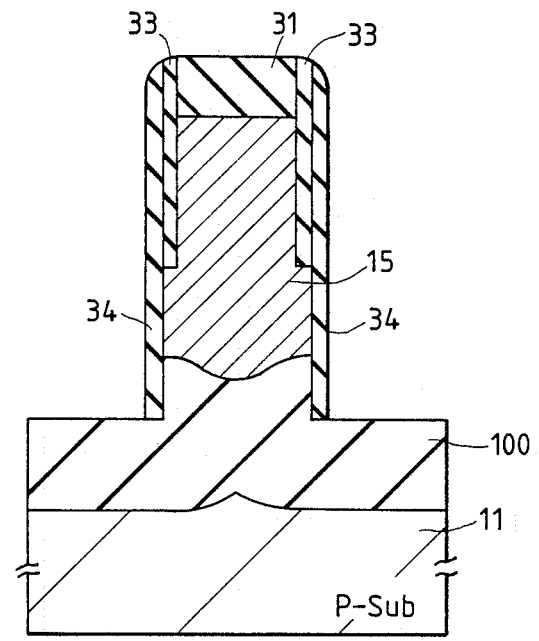

With reference to FIG. 3(d), the whole of the silicon island is oxidized. The antioxidation $Si_3N_4$ films 31, 33, and 34 protect the upper portion of the island. However, the root of the silicon island and the upper surface of substrate 11 are oxidized forming a $SiO_2$ film 100 that electrically isolates the silicon island 32 from the silicon substrate 11.

To form $SiO_2$, it is preferable to carry out thermal oxidation using $O_2$ containing a large amount of $H_2O$. For example, a $SiO_2$ film having a thickness of about 500 nm can be formed by carrying out oxidation for 100 minutes at 1000° C. and under 1 atm. In this way, the silicon island 32 and the silicon substrate 11 can be isolated from each other by $SiO_2$, provided that the dimension a of FIG. 3(c) of the bottom of the silicon island 15 is less than about 0.5 $\mu$m. In order to isolate the silicon island 15 from the silicon substrate 11 by oxidation, the thickness of $SiO_2$ formed by oxidation is selected so as to be equal to or greater than the dimension a.

Of course, the Si isotropic etching step to narrowing the root of the silicon island 15 shown in FIG. 3(c) may be omitted when the silicon substrate 11 and the silicon island 15 can be completely isolated from each other by the oxidation. For example, if the island is sufficiently narrow or the $SiO_2$ layer is sufficiently thick, the $SiO_2$ film can be formed across the root of the silicon island 15 without etching the root.

Figure 3E:
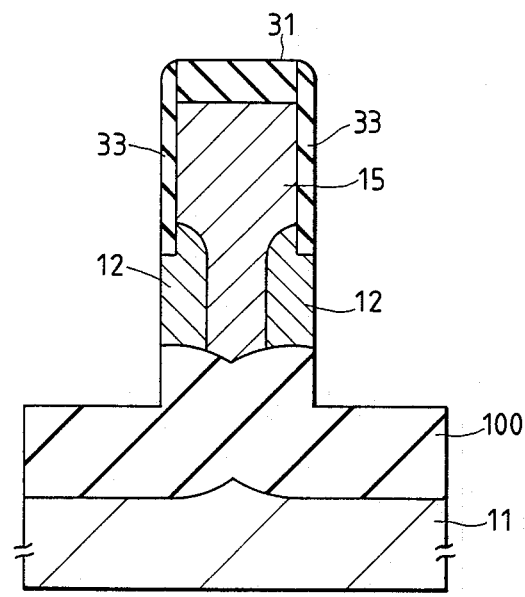

With reference to FIG. 3(e), the $Si_3N_4$ film 34 is removed. Then, impurity, especially phosphorus is doped into the surface region of the sidewall of the lower part of the silicon island 15 by vapor phase diffusion to form a highly doped n-type impurity layer 12. Phosphorus may be doped or diffused as far as the central portion of the silicon island 15.

To remove $Si_3N_4$, it is preferable to employ an isotropic etching that has high selectivity with respect to the $SiO_2$ layer 100, the silicon island 15, and the like. For example, phosphoric acid having a concentration of 85% or more may be employed. The temperature is preferably set at 160° C. to 180° C. Employment of the boiling temperature facilitates the temperature control. The boiling temperature rises as the phosphoric acid concentration is raised. The etching speed of $Si_3N_4$ is about 5 nm/min. at 160° C. and about 10 nm/min. at 180° C. When this phosphoric acid is employed, the selectivity rates with respect to $Si_3N_4/SiO_2$, and $Si_3N_4/Si$ are about 25 times and about three times, respectively. Since the selectivity rate with respect to $Si_3N_4/Si$ is relatively low, it is preferably to form a thin $SiO_2$ layer, for example, about 10 nm in thickness, between Si and $Si_3N_4$.

Figure 3F:
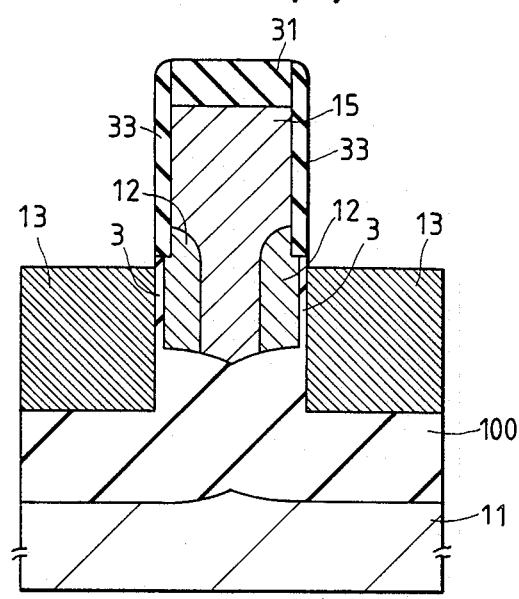

With reference to FIG. 3(f), the surface of the highly doped n-type impurity layer 12 is oxidized to form a capacitor insulator 3, especially $SiO_2$. Thereafter, a conductive material, especially a polycrystalline silicon film is buried in the trench in Si and then isotropic etching is effected as far as a desired position from the surface, thereby forming a plate electrode 13 of the capacitor.

The capacitor insulator 3 may be formed using any one of the following materials:
(a) $SiO_2$ formed by thermal oxidation or CVD;
(b) $Si_3N_4$ formed by thermal intriding that employs a $NH_3$ atmosphere or CVD;
(c) $Ta_2O_5$ formed by CVD or sputtering;
(d) a composite film of two or more of the three different kinds of material, i.e. (a), (b), and (c);
(e) a ferroelectric substance such as $KNO_3$, $Pb(Zr_{1-x}Ti_x)$, etc. formed by sputtering; and,
(f) a composite film containing (e) and at least one of the three, i.e. (a), (b), and (c).

The film thickness is preferably selected to fall in the range from at about 1 nm to 20 nm in terms of $SiO_2$ (having a specific inductive capacity of about 3.8) from the viewpoint of both electrostatic capacity and dielectric strength.

The polycrystalline silicon 13 is deposited with a thickness of, for example, 500 nm, by using CVD. After the deposition, etching is carried out to a depth which is equivalent to the film thickness plus about 1 $\mu m$, i.e. about 1 $\mu m$ below $Si_3N_4$ film 33. Preferably, a high selectivity dry etching that is done with a plasma atmosphere containing $SF_6$ as the principal constituent.

Figure 3G:
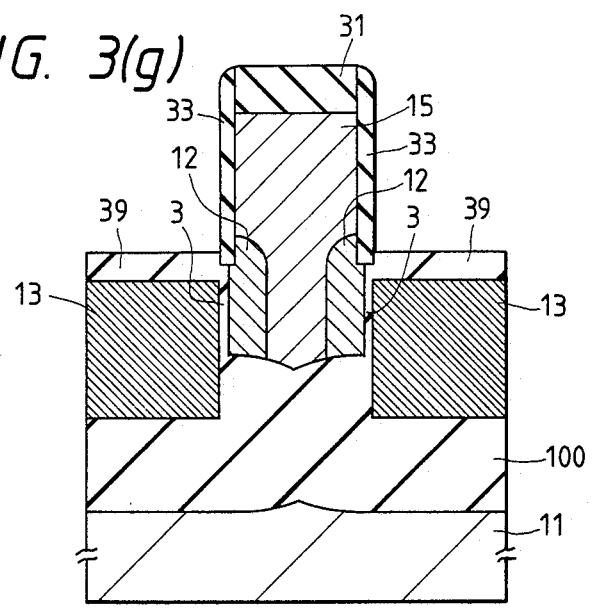

With reference to FIG. 3(g), the surface of the polycrystalline silicon film or electrode 13 is oxidized to form a $SiO_2$ insulator film 39.

To form the $SiO_2$ film 39, it is preferable to carry out oxidation using an atmosphere containing a large amount of $H_2O$. For example, $SiO_2$ film 39 having a thickness of about 300 nm can be formed on the polycrystalline silicon film 38 by carrying out oxidation for 50 minutes at 1000° C. under 1 atm.

Figure 3H:
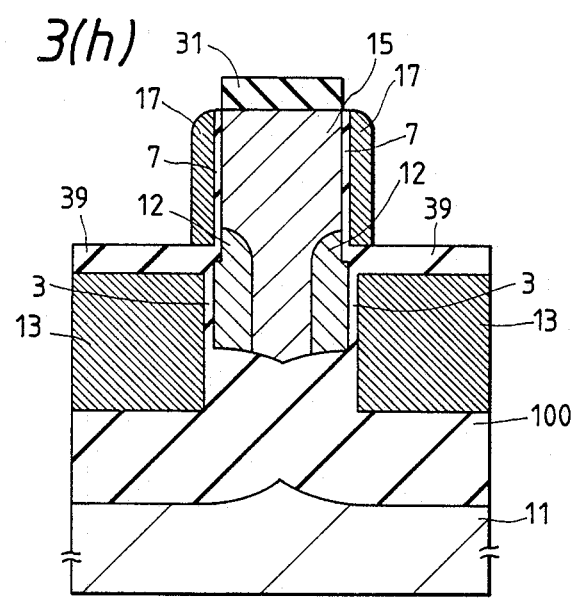

With reference to FIG. 3(h), the $Si_3N_4$ film 33 is removed. The island is oxidated to form a $SiO_2$ film 7, which serves as a gate insulator. Further, a polycrystalline silicon film 17 having a thickness of about 100 nm is deposited by CVD. Anisotropic dry etching is carried out so that the polycrystalline silicon film is left on the sidewall of the upper part of the silicon island 15, thereby forming a word line 17, which also operates as a gate electrode.

To remove the $Si_3N_4$ film 33, the above described phosphoric acid etching is preferred. To form the gate insulator, for example, an $O_2$ atmosphere is employed and oxidation is carried out at 950° C. and under 1 atm. A $SiO_2$ film having a thickness of about 10 nm is formed by continuing the oxidation for 30 minutes.

The polycrystalline silicon film has phosphorus diffused thereinto in advance in order to lower the electric resistance. Preferably, $POCl_3$ gas is used in CVD. Alternately, after the film formation, vapor phase diffusion of phosphorus using $POCl_3$ as a source material may be employed.

The anisotropic dry etching of the polycrystalline silicon film may be carried out by the use of a plasma atmosphere containing $CCl_4$ as the principal constituent.

Figure 3I:
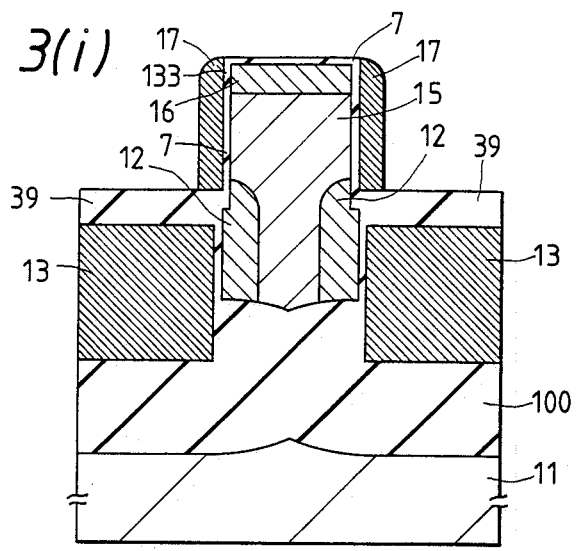

With reference to FIG. 3(i), the $Si_3N_4$ film 31 on the upper end surface of the silicon island 15 is removed and then the upper end surface of the silicon island 15 is oxidized to form a $SiO_2$ film 133. Thereafter, a highly doped n-type impurity layer 16 is formed by ion implantation.

To remove the $Si_3N_4$ film 31, it is preferable to employ hot phosphoric acid. In the ion implantation, $p^+$ or $AS^+$ is implanted at about $1 \times 10^{15}$ $cm^{-2}$ or more.

Figure 3J:
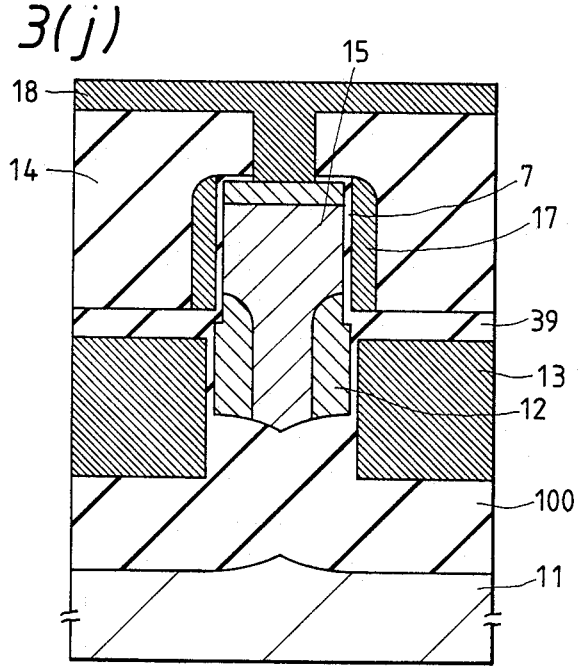

With reference to FIG. 3(j), a $SiO_2$ film 14 having a thickness of about 400 nm is formed by CVD. Then, a contact hole is formed in the $SiO_2$ film 14. Thereafter, a data line 18 is formed to complete a semiconductor memory.

The data line 18 may be formed using a material selected from among (a) highly doped impurity polysilicon, (b) a silicide such as $WSi_2$, $MoSi_2$, $TiSi_2$, etc., (c) a Ti compound such as TiN, TiW, etc., (d) a refractory metal such as W, Mo, etc., (e) a low-resistance metallic material such as Al or the like, and (f) a composite material comprising two or more of the five different kinds of material, i.e. (a) to (e).

Although in the following description of other embodiments of the present invention detail explanation such as that in the case of the first embodiment is omitted, the arrangements of the other embodiments will be readily understood by referring to the first embodiment.

Figure 4A:
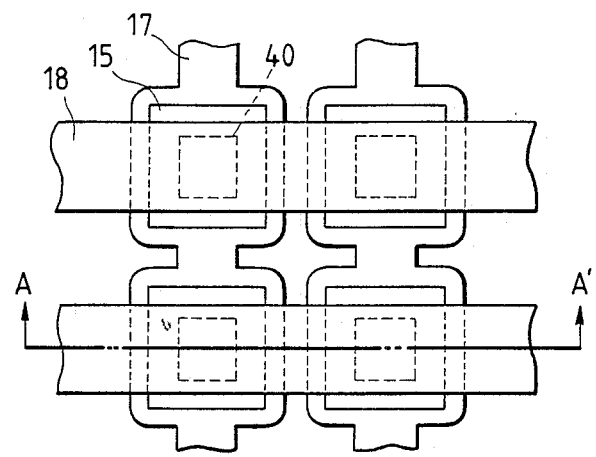
FIG. 4(a) is a plan view of a second embodiment of the semiconductor memory according to the present invention.
Figure 4B:
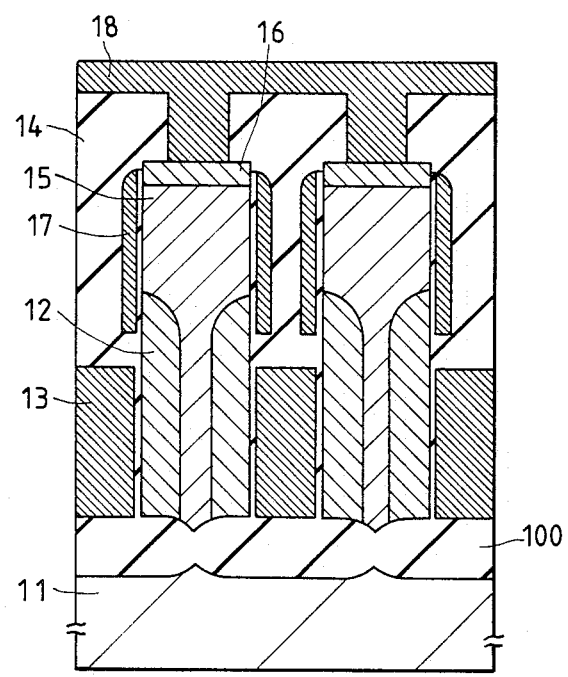
FIG. 4(b) is a sectional view taken along the line A—A' of FIG. 4(a)

FIGS. 4(a) and 4(b) show in combination one example of the layout of a semiconductor memory according to a second embodiment of the present invention. The same reference numerals indicate same or equivalent portion of the embodiment 1.

The thickness of word lines 17 is smaller than one half of the spacing between each pair of adjacent silicon islands. If the thickness is not smaller than one half of the spacing, word lines 17 which are adjacent to each other may be undesirably brought into electrical communication with each other. In this case, if the manufacturing process shown in FIG. 3 is employed, the word lines 17 are isolated from each other for each silicon island by the anisotropic dry etching carried out to process for word lines. In regard to the cross-sectional structure shown in FIG. 4(b), the word lines 17 need to be connected together in the direction perpendicular to the line A—A' as viewed in FIG. 4(a). To this end, a photoresist film (not shown) is formed over the joint of each pair of word lines 17 which are to be connected together. This resist film is employed as a mark during the anisotropic etching process for word lines. With this method, it is possible to realize interconnection of word lines between each pair of adjacent islands, as shown in FIG. 4(a). Reference numeral 40 denotes contact holes through the SiO$_2$ insulator 14.

Figure 5:
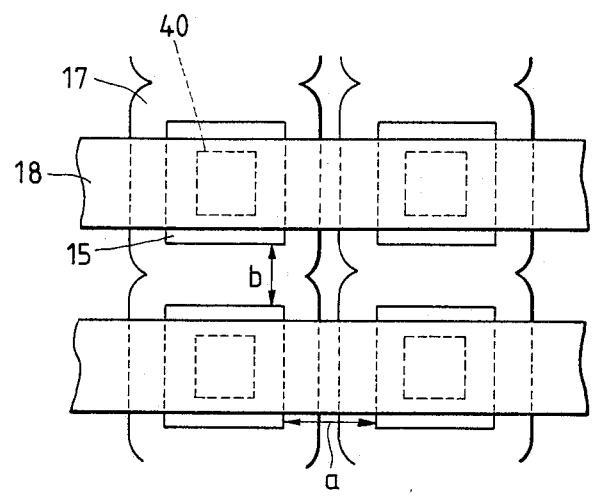
FIG. 5 is a plan view of a third embodiment of the semiconductor memory according to the present invention.

In the embodiment of FIG. 5, the spacing between each pair of silicon islands in the direction parallel to the data lines 18 is set at a. The spacing in the direction parallel to the word lines 17 is set at b which is different from a. If the thickness t of the polycrystalline silicon film for word lines is set so as to satisfy the following condition:

$$a/2 > t > b/2 \ldots \quad (1),$$

then it is possible to form word lines which are continuous only in the word line direction by the manufacturing process shown in FIG. 3 without providing the above described resist pattern for word lines.

Figure 6A:
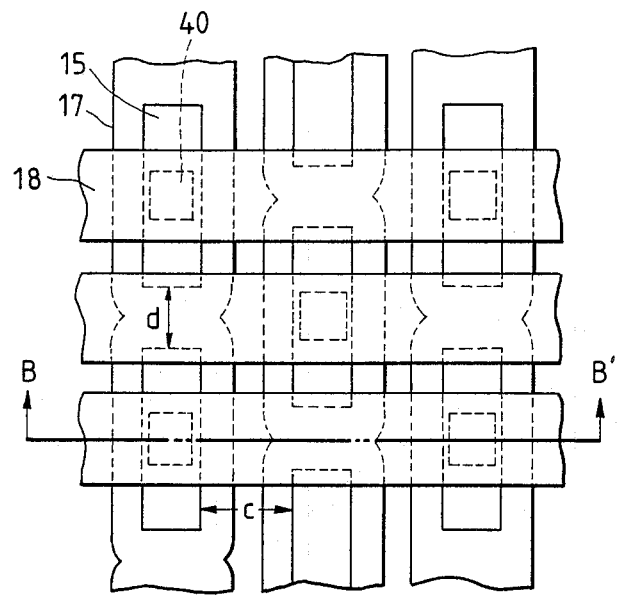
FIG. 6(a) is a plan view of a fourth embodiment of the semiconductor memory according to the present invention.
Figure 6B:
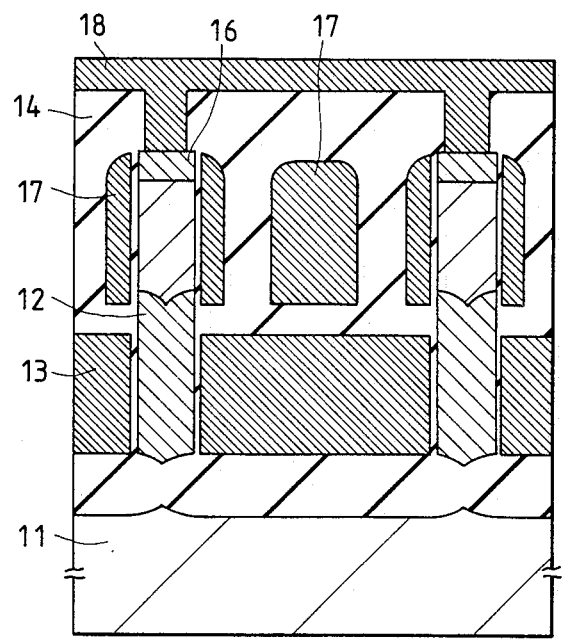
FIG. 6(b) is a sectional view taken along the line B—B' of FIG. 6(a)

FIG. 6(a) is a plan view of one example of the layout of a semiconductor memory according to a fourth embodiment of the present invention, while FIG. 6(b) is a sectional view of taken along the line B—B' of FIG. 6(a). In the embodiment of FIGS. 6(a) and 6(b), the same reference numeral indicates the same or equivalent portions of the first embodiment. The layout is arranged with folded bit lines. In this embodiment also, it is possible to form self-aligned word lines, which are continuous in the vertical direction. To this end, the spacings between the silicon islands in the above described directions c and d are selected such that d is less than c as in the embodiment of FIG. 5. The central word line 17' in FIG. 6(b) shows the word line material buried in the area between a pair of adjacent silicon islands where the spacing is narrower.

Figure 7A:
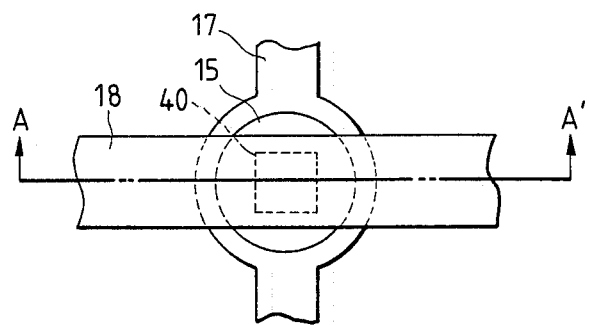
FIG. 7(a) is a plan view of a fifth embodiment of the semiconductor memory according to the present invention.
Figure 7B:
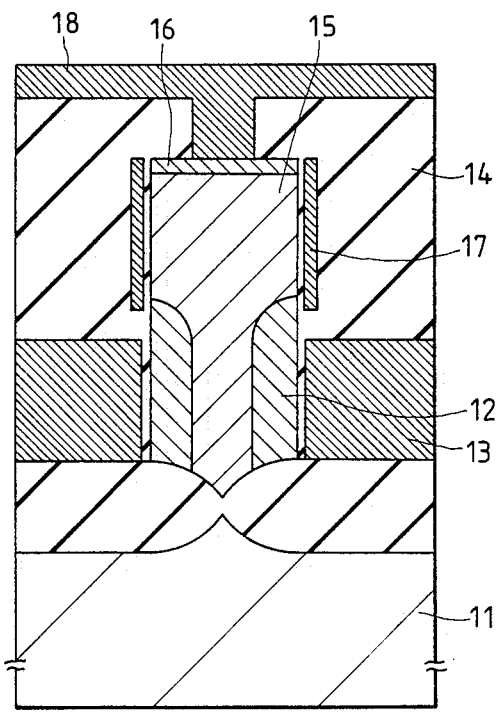
FIG. 7(b) is a sectional view taken along the line A—A' of FIG. 7(a)

FIGS. 7(a) and 7(b) show in combination one example of the layout of a semiconductor memory according to a fifth embodiment of the present invention. The semiconductor memory has cylindrical gates. FIG. 7(a) is a plan view of the semiconductor memory, while FIG. 7(b) is a sectional view taken along the line A—A' of FIG. 7(a). The same reference numeral indicates the same or equivalent portions of the first embodiment.

The feature of this embodiment resides in that it includes a MIS transistor that has a cylindrical gate electrode 17 formed on the surface of the sidewall of the upper part of a columnar silicon island 15. In comparison with the structures respectively shown in FIGS. 4, 5, and 6, the structure of this embodiment enables realization of an even more stable transistor operation. The side surface of the silicon island is not angular and it is therefore possible to apply a uniform electric field to the silicon island from the gate electrode.

Figure 8A:
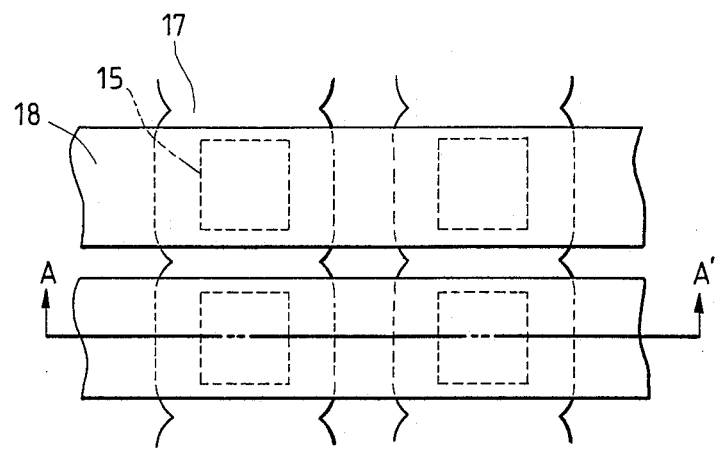
FIG. 8(a) is a plan view of a sixth embodiment of the semiconductor memory according to the present invention.
Figure 8B:
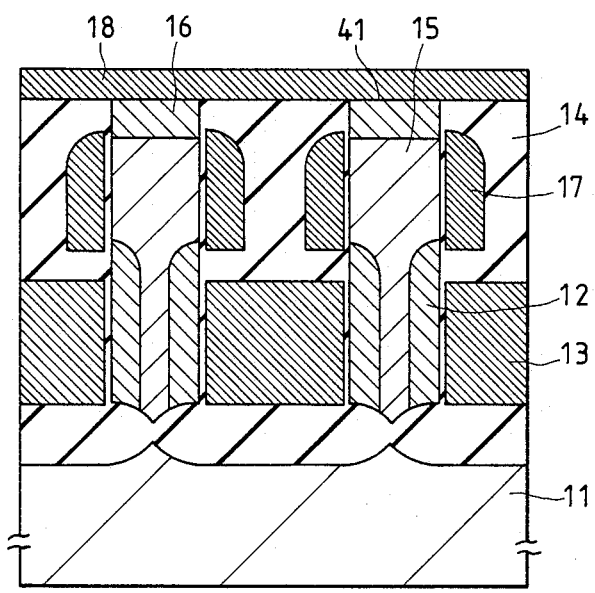
FIG. 8(b) is a sectional view taken along the line A—A' of FIG. 8(a)

FIGS. 8(a) and 8(b) show in combination one example of the layout of a semiconductor memory according to a sixth embodiment of the present invention. The semiconductor memory has data lines 18 which are formed self-alignedly. FIG. 8(a) is a plan view of the semiconductor memory, while FIG. 8(b) is a sectional view taken along the line A—A' of FIG. 8(a).

The feature of this embodiment resides in that each data line 18 is brought into direct contact with a highly doped n-type impurity diffused layer 16 formed on the upper end of the silicon island 15. The structure of this embodiment has the advantage that the manufacturing process is relatively simple and achieves very little memory cell structure.

One embodiment of the manufacturing process will be described herein with reference to FIGS. 9(a), 9(b), and 9(c).

Figure 9C:
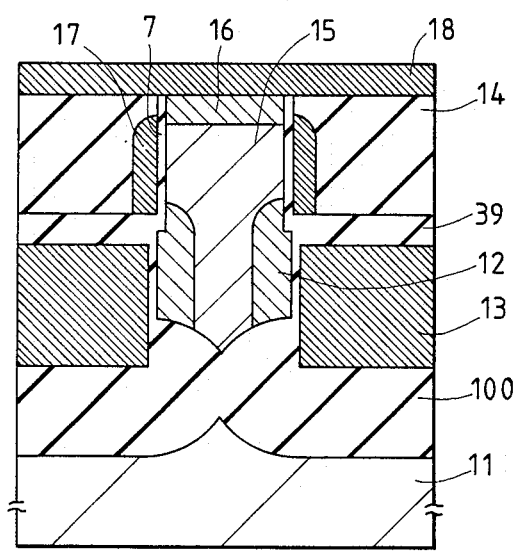
FIGS. 9(a) to 9(c) are sectional views showing a process for producing the sixth embodiment of the present invention.
Figure 9A:
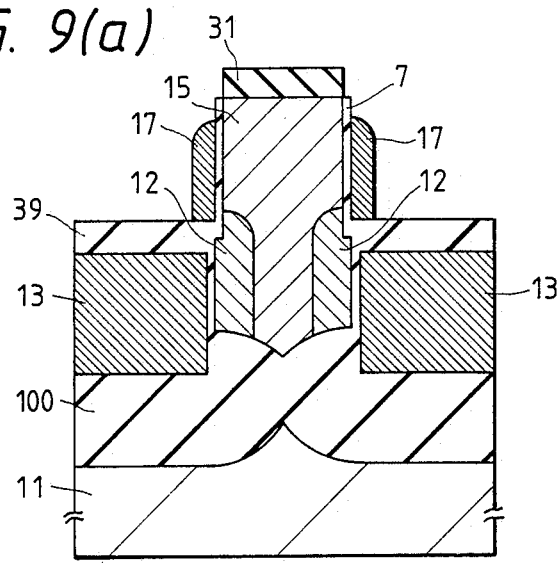

It should be noted that it is possible to employ the manufacturing steps shown in FIGS. 3(a) to 3(g) to obtain the structure which is to be subjected to the step shown in FIG. 9(a). The same reference numeral indicates the same or equivalent portions of the first embodiment.

After the step shown in FIG. 3(g) is completed, the Si$_3$N$_4$ film 33 is removed by the use of, for example, phosphoric acid. A SiO$_2$ film 7 is then formed by carrying out oxidation at 900° C. for 30 to 60 minutes by way of example, as shown in FIG. 9(a). Thereafter, polycrystalline silicon having a thickness of about 100 nm is deposited by CVD. Next, diffusion of phosphorus is carried out. Thereafter, a word line 17 is formed by an anisotropic dry etching. At this time, the upper end of the word line 17 is below the upper end surface of the silicon island 15.

Figure 9B:
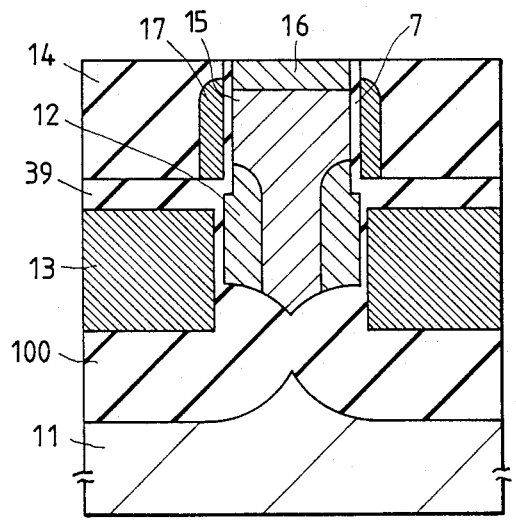

Next, as shown in FIG. 9(b), the Si$_3$N$_4$ film 31 on the surface of the silicon island 15 is removed by the use of, for example, phosphoric acid. A highly doped n-type impurity layer 16 is formed by ion implantation. Further, SiO$_2$ having a thickness of about 500 nm is deposited by CVD. The SiO$_2$ is etched by isotropic dry etching so that SiO$_2$ is left only in the recess in the surface.

Finally, a conductive material for data lines 18, such as Al, a polycrystalline silicon, W, WSi$_2$, etc., is deposited and defined to complete a semiconductor memory cell shown in FIG. 9(c).

This manufacturing process has not need to use a photolithography mask to form a contact hole for contact with the memory cell and is therefore relatively simple.

Figure 10A:
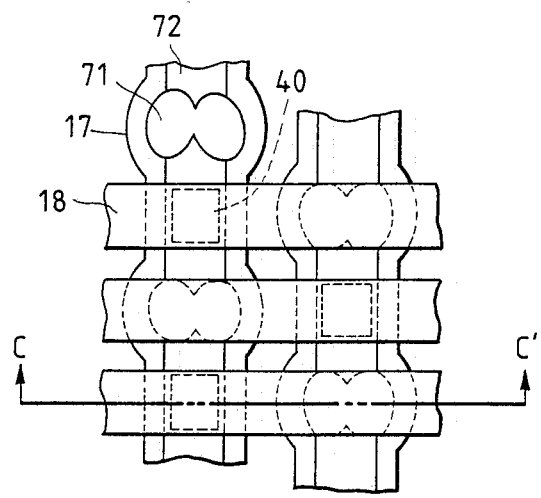
FIG. 10(a) is a plan view of a seventh embodiment of the semiconductor memory according to the present invention.
Figure 10B:
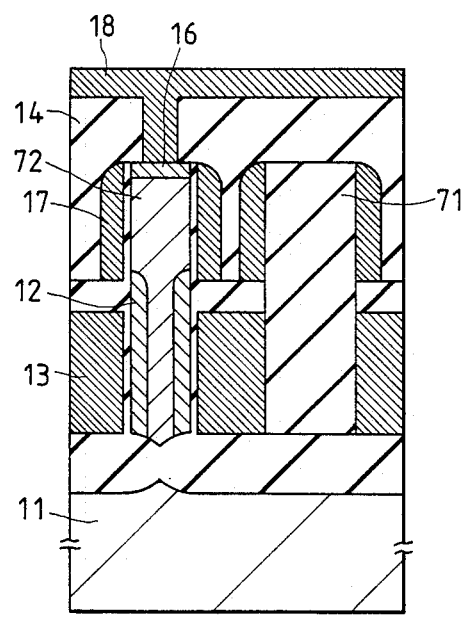
FIG. 10(b) is a sectional view taken along the line C—C' of FIG. 10(a)

FIG. 10(a) is a plan view showing one example of the layout of a semiconductor memory according to a seventh embodiment of the present invention. FIG. 10(b) is a sectional view taken along the line C—C' of FIG. 10(a). The same reference numeral indicates the same or equivalent portions of the first embodiment. In this embodiment, silicon islands 72 are isolated from each other by insulator portion 71, oxidizing one continuous silicon line at regular spacings. In the case of the layout shown in FIG. 10(a), it is possible to form independent memory cells on both the right and left hand side surfaces, respectively, of the silicon island 72 because the word lines 17 are separated right and left hand side surfaces. Accordingly, two memory cells can be formed on one silicon island 72.

Figure 11A:
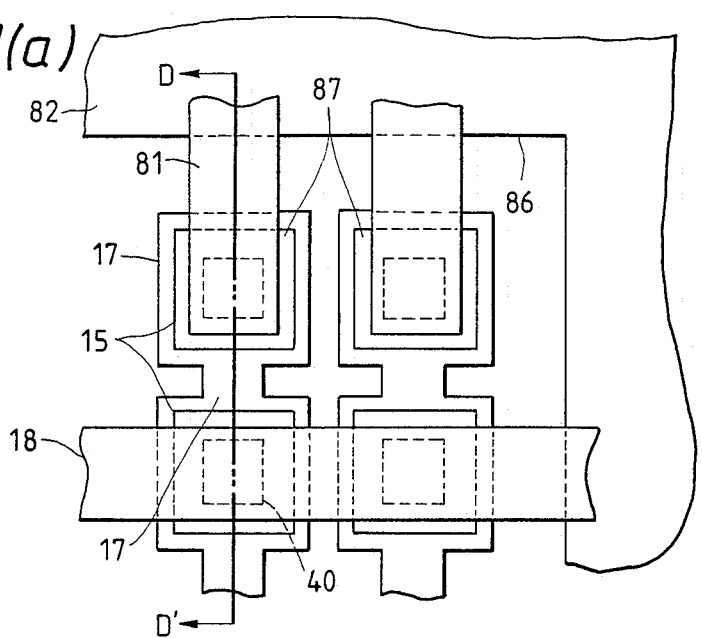
FIG. 11(a) is a plan view of an eighth embodiment of the semiconductor memory of the present invention; and, FIG. 11(b) is a sectional view taken along the line D—D' of FIG. 11(a).
Figure 11B:
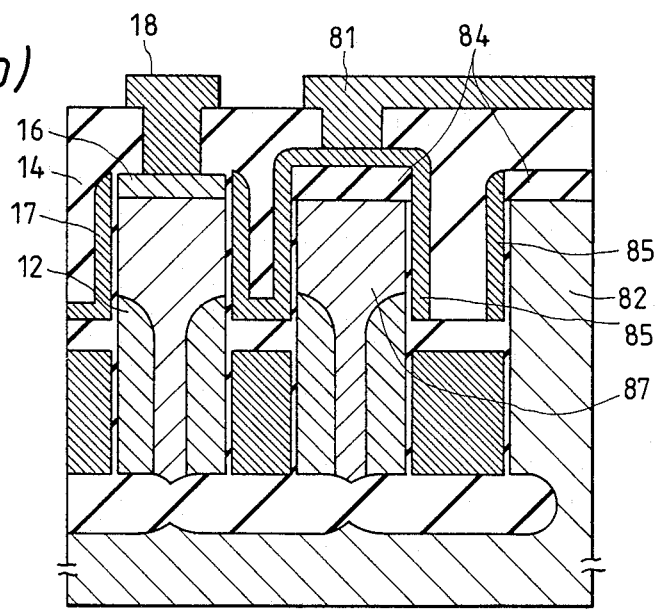

FIG. 11(a) is a plan view showing an eighth embodiment of the present invention. FIG. 11(b) is a sectional view taken along the line D—D' of FIG. 11(a). In this embodiment, one example of the arrangement of a section for feeding power to the word lines is shown. A peripheral circuit region 82, which is outside of the memory cells, is formed on the silicon surface, which is left unetched. According to the manufacturing process shown in FIGS. 3(a) through 3(j), the word line material is left on the sidewalls of all the silicon islands. Therefore, the word line material 85 is also left on the sidewall of the peripheral circuit region 82. If the word lines are elongated to connect together the memory cell region and the peripheral circuit region 82, all the word lines are connected through the word line material 85 which is left on the sidewall of the peripheral circuit region 82. Accordingly, in this embodiment, silicon islands 87 which are not used as memory cells are formed at the periphery of the memory cell region to provide contact with the word lines on the islands 87 and connection with the peripheral circuit is effected using another wiring material 81.

In each of the foregoing embodiments, the present invention has been described by way of one example in which it is applied to an n-channel type memory cell. However, a similar structure can be realized in the case of a p-channel type memory cell.

As has been described above, according to the present invention, even if alpha-particles are injected into the semiconductor substrate and positive or negative charges are thereby generated in the semiconductor substrate, it is possible to prevent soft error phenomena, which would otherwise occur due to intrusion of these charges into memory cells since semiconductor islands on which the memory cells are formed are isolated from the semiconductor substrate. It is a matter of course that the semiconductor memory of the present invention is similarly resistant to noise charges applied from a peripheral circuit.

It is possible according to the present invention, especially in combination with the embodiments of FIG. 5 and FIGS. 8(a) through 9(c), to form memory elements in self-alignment after the formation of the silicon islands. It is unnecessary to ensure a margin for mask alignment and hence, possible to form a memory cell in a minimized region.

It is further understood by those skilled in the art that the foregoing description is a preferred embodiment of the disclosed device and that various changes and modifications may be made in the invention without departing from the spirit and scope thereof.

Having thus described the preferred embodiment, the invention is now claimed to be:

1. A semiconductor memory integrated circuit comprising:
    at least one pair of switching and charge-storage devices are disposed adjacent upper and lower sides, respectively, of each of a plurality of semiconductor islands which are formed on a semiconductor substrate, the islands being isolated from said semiconductor substrate and from each other by an insulator means, said switching and charge-storage devices having substantially the same width.

2. A semiconductor memory comprising:
    a switching device and a charge storage device which are disposed adjacent upper and lower sides, respectively, of each semiconductor island which is formed on a semiconductor substrate, each island being isolated from said semiconductor substrate by means of an insulator, an impurity doped layer being formed in a surface region of at least a sidewall of a lower part of each semiconductor island, each semiconductor island being of a first conductivity type, said impurity doped layer being of a second conductivity type which is opposite to said first conductivity type, said charge-storage device comprising a capacitor insulator along a surface of said impurity doped layer, and an electrode formed on said capacitor insulator, said switching device and said charge-storage device having substantially the same width.

3. The semiconductor memory according to claim 2 wherein said semiconductor island and substrate are silicon.

4. The semiconductor memory according to claim 2 wherein said switching device is a vertical metal-insulator-semiconductor (MIS) transistor having a cylindrical gate electrode formed on a sidewall of the semiconductor island.

5. The semiconductor memory according to claim 2 wherein said semiconductor islands are arranged in lines, said linear semiconductor islands being isolated from each other at constant regular spacings by an insulator, the switching and charge-storage devices are isolated from each other by said insulator.

6. The semiconductor memory according to claim 2 wherein the semiconductor islands are isolated from each other by an insulator and are arranged at regular spacings, each semiconductor island having at least one pair of switching and charge-storage devices to form an integrated circuit.

7. The semiconductor memory according to claim 6 further including at least one additional semiconductor island, said additional semiconductor island having a gate electrode and a contact for connection with a peripheral circuit.

8. A semiconductor memory comprising:
    a switching device and a charge-storage device which are disposed adjacent upper and lower sides, respectively, of each of a plurality of semiconductor islands which are formed on a semiconductor substrate, the semiconductor islands being isolated from each other and from said semiconductor substrate by an insulator means and being arranged at regular spacings, each semiconductor island having at least one pair of switching and charge storage devices to form an integrated circuit, said switching and charge-storage devices having substantially the same width.

9. The semiconductor memory according to claim 8 further including at least one additional semiconductor island, said additional semiconductor island having a gate electrode and a contact for connection with a peripheral circuit.

10. The semiconductor memory according to claim 8 wherein said semiconductor island and substrate are silicon.

11. The semiconductor memory according to claim 8 wherein an impurity doped layer is formed in a surface region of at least a sidewall of a lower part of each semiconductor island, each semiconductor island being of a first conductivity type, said impurity doped layer being of a second conductivity type which is opposite to said first conductivity type, said charge-storage device comprising a capacitor insulator along a surface of said impurity doped layer and an electrode formed on said capacitor insulator.

12. The semiconductor memory according to claim 8 wherein said semiconductor islands are arranged in lines, said linear semiconductor islands being isolated from each other at the constant regular spacings by an insulator, the switching and charge-storage devices are isolated from each other by said insulator.

13. A semiconductor memory comprising:
    a body;
    an insulator disposed on the body;
    a semiconductor island which is disposed on the insulator and completely electrically isolated from the body by the insulator;
    a capacitor insulator disposed on a sidewall of the semiconductor island;
    a plate electrode disposed on the capacitor insulator;
    a gate insulator disposed on the sidewall of the semiconductor island;
    a gate electrode disposed on the gate insulator;

a first high impurity doped region provided in a part of the semiconductor island, the first high impurity doped region operating as one of a source and a drain;

a second high impurity doped region provided in a part of the semiconductor island, the second high impurity doped region operating as one of a drain and a source; and, a data line electrically coupled to the second high impurity region.

14. The semiconductor memory according to claim 13 wherein the semiconductor island is made of silicon and the body is made of silicon;

the gate insulator includes at least a SiO$_2$ film; and, the capacitor insulator includes at least one selected from among a SiO$_2$ film, a Si$_3$N$_4$ film, a Ta$_2$O$_5$ film, NKO$_3$Pb(Zr$_{1-x}$Ti$_x$) film, and a combination thereof.

15. The semiconductor memory according to claim 14 wherein the semiconductor island, the plate electrode, the capacitor insulator, the gate insulator, and the gate electrode are disposed at respective fixed positions which are determined only by process conditions.

16. The semiconductor memory according to claim 18 further including a plurality of the semiconductor islands, the spacing between each pair of adjacent semiconductor islands in a word line direction being smaller than the spacing in a data line direction.

17. The semiconductor memory according to claim 13 wherein the data line is disposed above the word line through an insulator; and, the data line is disposed substantially horizontally, a lower surface of the data line being on substantially the same level as an upper surface of the semiconductor island.

18. The semiconductor memory according to claim 13 wherein the semiconductor island is columnar and the gate electrode is annular.

19. A semiconductor memory according to claim 18 wherein said switching device is a vertical metal insulator-semiconductor (MIS) and the gate electrode is cylindrical.

20. A semiconductor memory comprising:
a body;
a first insulator portion provided on the body;
a semiconductor island which is provided on the insulator and completely electrically isolated from the body by the insulator;
a second insulator portion provided on a sidewall of the semiconductor island;
a plate electrode provided adjacent the second insulator portion;
a gate electrode provided adjacent the second insulator portion;
a first high impurity doped region provided in a part of the semiconductor island;
a second high impurity doped region provided in a part of the semiconductor island;
a data line electrically coupled to one of the high impurity doped regions;
wherein the semiconductor island, the plate electrode, the second insulator portion, and the gate electrode are provided at respective fixed positions which are determined only by process conditions.

21. The semiconductor memory according to claim 20 wherein the semiconductor island is made of silicon and the body is made of silicon.

22. The semiconductor memory according to claim 21 wherein the second insulator portion includes at least a SiO$_2$ film.

23. The semiconductor memory according to claim 22 wherein the second insulator portion further includes at least one selected from among a Si$_3$N$_4$ film, a Ta$_2$O$_5$ film, KNO$_3$Pb(Zr$_{1-x}$Ti$_x$) film, and combinations thereof.

24. The semiconductor memory according to claim 22 further including a plurality of the semiconductor islands, the spacing between each pair of adjacent semiconductor islands in a word line direction being smaller than the spacing in a data line direction.

25. The semiconductor memory according to claim 22 wherein the semiconductor island is columnar and the gate electrode is annular.

26. The semiconductor memory according to claim 22 wherein the data line is disposed above the word line through the first insulator portion.

27. The semiconductor memory according to claim 26 wherein the data line is disposed substantially horizontally and a lower surface of the data line is on substantially the same level as an upper surface of the semiconductor island.

* * * * *